(12) United States Patent
Nakagawa et al.

(10) Patent No.: US 9,252,295 B2
(45) Date of Patent: Feb. 2, 2016

(54) COATING MATERIAL, COATING FILM, BACKSHEET FOR SOLAR CELL MODULE, AND SOLAR CELL MODULE

(71) Applicant: DAIKIN INDUSTRIES, LTD., Osaka-Shi, Osaka (JP)

(72) Inventors: Hideto Nakagawa, Settsu (JP); Kenji Gobou, Settsu (JP); Hidenori Ozaki, Settsu (JP); Kazuya Asano, Settsu (JP); Shigehito Sagisaka, Settsu (JP)

(73) Assignee: DAIKIN INDUSTRIES, LTD., Osaka (JP)

( * ) Notice: Subject to any disclaimer, the term of this patent is extended or adjusted under 35 U.S.C. 154(b) by 0 days.

(21) Appl. No.: 14/355,790

(22) PCT Filed: Nov. 2, 2012

(86) PCT No.: PCT/JP2012/078537
§ 371 (c)(1),
(2) Date: May 1, 2014

(87) PCT Pub. No.: WO2013/065851
PCT Pub. Date: May 10, 2013

(65) Prior Publication Data
US 2014/0290743 A1  Oct. 2, 2014

(30) Foreign Application Priority Data
Nov. 4, 2011 (JP) .................................. 2011-242521

(51) Int. Cl.
*H01L 31/0216* (2014.01)
*H01L 31/048* (2014.01)
*C09D 175/04* (2006.01)
*C08G 18/62* (2006.01)
*C08G 18/76* (2006.01)
*C08G 18/80* (2006.01)
*H01L 31/049* (2014.01)
*C08G 18/75* (2006.01)

(52) U.S. Cl.
CPC ........ *H01L 31/0216* (2013.01); *C08G 18/6279* (2013.01); *C08G 18/757* (2013.01); *C08G 18/7642* (2013.01); *C08G 18/8025* (2013.01); *C08G 18/8029* (2013.01); *C09D 175/04* (2013.01); *H01L 31/049* (2014.12)

(58) Field of Classification Search
CPC .......................... H01L 31/0216; H01L 31/0487
See application file for complete search history.

(56) References Cited

U.S. PATENT DOCUMENTS

| | | | |
|---|---|---|---|
| 5,780,530 A | 7/1998 | Mizutani et al. | |
| 6,309,708 B1 | 10/2001 | Mohri et al. | |
| 2001/0056166 A1 | 12/2001 | Mohri et al. | |
| 2010/0180938 A1 | 7/2010 | Nagato et al. | |
| 2011/0083726 A1 | 4/2011 | Takayanagi et al. | |
| 2012/0048352 A1 | 3/2012 | Nagato et al. | |
| 2012/0100369 A1* | 4/2012 | Hanazawa et al. | 428/352 |
| 2013/0092217 A1 | 4/2013 | Gobou et al. | |

FOREIGN PATENT DOCUMENTS

| | | |
|---|---|---|
| EP | 1938967 A1 | 7/2008 |
| JP | 2-289639 A | 11/1990 |
| JP | 04-106117 A | 4/1992 |
| JP | 07-002753 A | 1/1995 |
| JP | 07-176775 A | 7/1995 |
| JP | 08-060030 A | 3/1996 |
| JP | 9-40905 A | 2/1997 |
| JP | 09-249732 A | 9/1997 |
| JP | 2956166 B2 | 10/1999 |
| JP | 11-349893 A | 12/1999 |
| JP | 2004-204205 A | 7/2004 |
| JP | 2004-214342 A | 7/2004 |
| JP | 2004-307666 A | 11/2004 |
| JP | 2005-105111 A | 4/2005 |
| JP | 2006-188639 A | 7/2006 |
| JP | 2007-35694 A | 2/2007 |
| JP | 2009-144009 A | 7/2009 |
| JP | 2010-24386 A | 2/2010 |
| JP | 2010-212633 A | 9/2010 |
| JP | 2010-222559 A | 10/2010 |
| JP | 2011-162598 A | 8/2011 |
| JP | 2011-210835 A | 10/2011 |
| JP | 2013-136735 A | 7/2013 |
| JP | 2013-136736 A | 7/2013 |
| WO | 97/11130 A1 | 3/1997 |
| WO | 2006/077751 A1 | 7/2006 |

(Continued)

OTHER PUBLICATIONS

International Search Report of PCT/JP2012/078537 dated Feb. 12, 2013.
International Preliminary Report on Patentability dated Jun. 3, 2014, issued by the International Searching Authority in corresponding International Application No. PCT/JP2012/080453.
International Preliminary Report on Patentability dated May 6, 2014, issued by the International Searching Authority in corresponding International Application No. PCT/JP2012/078537.

(Continued)

*Primary Examiner* — Robert Harlan
(74) *Attorney, Agent, or Firm* — Sughrue Mion, PLLC

(57) ABSTRACT

An object of the present invention is to provide a coating material that can form a coating film that has an excellent adherence for sealants in solar cell modules as well as an excellent resistance to blocking. Further objects are to provide this coating film, a solar cell module backsheet that has this coating film, and a solar cell module that has this coating film. The present invention relates to a coating material that contains a curable functional group-containing fluorinated polymer and a polyisocyanate compound derived from at least one isocyanate selected from the group consisting of xylylene diisocyanate and bis(isocyanatomethyl)cyclohexane.

9 Claims, 1 Drawing Sheet

(56) References Cited

FOREIGN PATENT DOCUMENTS

| WO | 2007/010706 | A1 | | 1/2007 | |
|----|----|----|----|----|----|
| WO | 2007/063698 | A1 | | 6/2007 | |
| WO | WO 2007/063698 | A1 | * | 6/2007 | .......... H01L 31/0216 |
| WO | 2009/157449 | A1 | | 12/2009 | |
| WO | 2010/035782 | A1 | | 4/2010 | |
| WO | 2010/126000 | A1 | | 11/2010 | |
| WO | 2011/158898 | A1 | | 12/2011 | |
| WO | 2013/080913 | A1 | | 6/2013 | |
| WO | 2013/080918 | A1 | | 6/2013 | |

OTHER PUBLICATIONS

International Preliminary Report on Patentability dated Jun. 10, 2014, issued by the International Searching Authority in corresponding International Application No. PCT/JP2012/080482.
Communication dated Jun. 18, 2015 from the European Patent Office in counterpart application No. 12845816.3.

* cited by examiner

COATING MATERIAL, COATING FILM, BACKSHEET FOR SOLAR CELL MODULE, AND SOLAR CELL MODULE

CROSS REFERENCE TO RELATED APPLICATIONS

This is a National Stage of International Application No. PCT/JP2012/078537 filed Nov. 2, 2012, claiming priority based on Japanese Patent Application No. 2011-242521 filed Nov. 4, 2011, the contents of all of which are incorporated herein by reference in their entirety.

TECHNICAL FIELD

The present invention relates to a coating material, a coating film, a backsheet for a solar cell module, and a solar cell module. More particularly, the present invention relates to a coating material that is well qualified for coating the backsheet in a solar cell module, to the coating film obtained from this coating material, and to a solar cell module backsheet and a solar cell module that have this coating film.

BACKGROUND ART

A solar cell module typically contains a surface layer, a sealant layer that seals a solar cell, and a backsheet. A copolymer of ethylene and vinyl acetate (also referred to herebelow as EVA) is typically used as the sealant that forms the sealant layer.

A variety of properties, such as mechanical strength, weathering resistance, waterproofness and moistureproofness, electrical insulation, and so forth, are required of the backsheet. Backsheets typically have a multilayer structure and, for example, may contain—considered in sequence from the side in contact with the sealant layer of the solar cell—a weathering-resistant layer/an electrically insulating layer/a waterproof and moistureproof layer/a back layer disposed at the back side of the solar cell.

A film of polyvinyl fluoride is generally used for this weathering-resistant layer and back layer because polyvinyl fluoride exhibits an excellent weathering resistance, waterproofness and moistureproofness, and electrical insulation behavior, while a PET film is generally used for the substrate sheet. In those instances where a high waterproofing and moistureproofing effect is required of the backsheet, a PET film bearing a vapor-deposited metal compound, e.g., silica, or a metal layer, e.g., an aluminum foil, is provided at the surface of the substrate sheet.

In order to satisfy various required properties, e.g., durability, light-blocking ability, and so forth, a backsheet typically has a thickness of 20 to 500 µm. However, there has been demanded in recent years for a reduction in backsheet weight and thickness.

As a consequence, the formation of the same layers using resin coating materials in place of resin sheets has been proposed. For example, the use of an epoxy resin coating material as a resin coating material has been investigated (refer, for example, to Patent Literature 1). However, epoxy resin coating materials have not been realized at a practical level because their cured coating films have an unsatisfactory weathering resistance.

In addition, a two-layer backsheet has been proposed in which a metal substrate (a water-impermeable sheet) is coated with a PVdF-based coating material provided by the incorporation of a specific amount of a tetraalkoxysilane or its partial hydrolyzate into functional group-free PVdF (refer, for example, to Patent Literature 2). Considering this PVdF-based coating material, PVdF, because it lacks functional groups, by itself also has a poor adhesiveness for the EVA used as the sealant. Patent Literature 2 seeks to improve upon this point through the incorporation of a specific amount of a tetraalkoxysilane or partial hydrolyzate thereof and inducing the orientation of the tetraalkoxysilane or partial hydrolyzate thereof at the interface with the EVA.

A solar cell module backsheet has also been proposed in which a cured coating film from a curable functional group-containing fluorinated polymer coating material is formed on at least one side of a water-impermeable sheet (refer, for example, to Patent Literature 3). A curable tetrafluoroethylene (TFE)-based copolymer (Zeffle GK570) is disclosed as the curable functional group-containing fluorinated polymer. Patent Literature 3 teaches that, through the use of this curable functional group-containing fluorinated polymer coating material, the thickness of the backsheet can be reduced in comparison to the conventional application of a sheet and a reduction in thickness and weight can thus be devised while maintaining the mechanical strength, and that, due to the introduction of a functional group into the fluorinated polymer, the adhesiveness to the water-impermeable sheet can be improved even without the addition of, for example, a tetraalkoxysilane.

A solar cell module backsheet has also been proposed in which a cured coating film layer is formed, on one side or both sides of a substrate sheet, from a coating material that contains a fluorinated polymer (A) that has a repeat unit based on (a) a fluoroolefin, a repeat unit based on (b) a crosslinking group-containing monomer, and a repeat unit based on (c) an alkyl group-containing monomer in which a polymerizable unsaturated group is connected by an ether bond or ester bond to a $C_{2-20}$ straight-chain or branched alkyl group that does not contain the quaternary carbon atom (refer, for example, to Patent Literature 4). Patent Literature 4 teaches that such a cured coating film layer has a particularly good flexibility and a particularly good adherence to the substrate and is free of the problems of cracks, breakage, whitening, and debonding and that a lightweight, high-productivity solar cell module backsheet is obtained.

CITATION LIST

Patent Literature

Patent Literature 1: JP-A H07-176775
Patent Literature 2: JP-A 2004-214342
Patent Literature 3: WO 2007/010706
Patent Literature 4: WO 2009/157449

SUMMARY OF INVENTION

Technical Problem

As indicated in the preceding, there have been various investigations into coating materials for forming a cured coating film layer that could be favorably used in the backsheet of a solar cell module; however, there is still room for investigation in order to realize even higher levels for the various required properties.

For example, the PVdF-based coating material of Patent Literature 2 seeks to improve the adhesiveness between the cured coating film and the EVA sealant, but it really cannot be said that a satisfactory adhesiveness is obtained.

There is also room for additional improvements in the adherence with the sealant in the case of the fluorinated polymer coating materials of Patent Literature 3 and Patent Literature 4.

A better inhibition of blocking has also been sought from conventional coating materials. Here, blocking refers to a phenomenon in which, when a coated product is wound up or stacked, unwanted adhesion occurs between surfaces in contact with each other (an uncoated surface in contact with a coated surface, a coated surface in contact with a different coated surface, and so forth), which can interfere with separation and can cause the coating film on a coated surface to adhere to a surface in contact with the coated surface.

The present invention was accomplished considering the existing circumstances described above and has as an object the introduction of a coating material that can form a coating film that has an excellent adherence for the sealant in a solar cell module as well as an excellent resistance to blocking. Further objects are the introduction of this coating film, the introduction of a solar cell module backsheet that has this coating film, and the introduction of a solar cell module that has this coating film.

Solution to Problem

The present inventor carried out various investigations into a coating material that could form a coating film that would have an excellent adherence for the sealant in a solar cell module as well as an excellent resistance to blocking with respect to surfaces in contact with the coating film, and in the course thereof discovered that, through the suitable selection of the kind of curing agent in a coating material containing a curable functional group-containing fluorinated polymer, a coating material can be obtained that provides a cured coating film that exhibits an excellent adherence (adhesiveness) with sealants as well as an excellent resistance to blocking with respect to surfaces in contact with the coating film. That is, it was discovered that, when the curing agent is a polyisocyanate compound derived from at least one isocyanate selected from the group consisting of xylylene diisocyanate and bis(isocyanatomethyl)cyclohexane, the adherence between the coating film and the sealant is substantially improved—particularly when the sealant contains EVA—and that when a product (e.g., a sheet and so forth) bearing such a coating film is wound up or stacked, this coating film can sufficiently inhibit blocking with an uncoated surface or another coated surface with which the coating film is in contact. It was also discovered that, through the formation of this coating film on a substrate such as a water-impermeable sheet, a solar cell module backsheet is obtained that exhibits an excellent adherence to sealants and an excellent resistance to blocking with surfaces in contact with the coating film. The present invention was achieved based on these discoveries.

Thus, the present invention is a coating material that contains a curable functional group-containing fluorinated polymer and a polyisocyanate compound derived from at least one isocyanate selected from the group consisting of xylylene diisocyanate and bis(isocyanatomethyl)cyclohexane.

The present invention is also a coating film obtained from the aforementioned coating material.

The present invention is also a backsheet for a solar cell module, wherein the backsheet has a water-impermeable sheet and a coating film formed from the aforementioned coating material and formed on at least one side of the water-impermeable sheet.

The present invention is also a solar cell module that has a water-impermeable sheet, a coating film formed from the aforementioned coating material and formed on at least one side of this water-impermeable sheet, and a sealant layer formed on the coating film.

The present invention is described in detail below.

The coating material of the present invention contains a curable functional group-containing fluorinated polymer.

The curable functional group-containing fluorinated polymer can be exemplified by a polymer provided by the introduction of a curable functional group into a fluorinated polymer. This fluorinated polymer encompasses resinous polymers that have a distinct melting point, elastomeric polymers that exhibit rubbery elasticity, and thermoplastic elastomeric polymers intermediate between these two.

The functional group that imparts curability to the fluorinated polymer can be exemplified by the hydroxyl group (but excluding the hydroxyl group present in the carboxyl group; this also applies hereafter), the carboxyl group, the group represented by —COOCO—, the cyano group, the amino group, the glycidyl group, the silyl group, the silanate group, and the isocyanate group, and is selected as appropriate inconformity with the ease of production of the polymer and the curing system. Among the preceding, at least one group selected from the group consisting of the hydroxyl group, the carboxyl group, the group represented by —COOCO—, the cyano group, the amino group, and the silyl group is preferred for the excellent curing reactivity thereby provided, while at least one group selected from the group consisting of the hydroxyl group, the carboxyl group, the amino group, and the silyl group is more preferred. At least one group selected from the group consisting of the hydroxyl group and the carboxyl group is even more preferred in particular for the excellent reactivity and ease of polymer acquisition thereby provided. These curable functional groups are generally introduced into the fluorinated polymer by copolymerization between a fluorine-containing monomer and a curable functional group-containing monomer.

The curable functional group-containing monomer can be exemplified by hydroxyl group-containing monomers, carboxyl group-containing monomers, amino group-containing monomers, and silicone-based vinyl monomers, and a single one of these may be used or two or more may be used.

The curable functional group-containing fluorinated polymer under consideration preferably contains a polymerization unit based on a fluorine-containing monomer and a polymerization unit based on at least one curable functional group-containing monomer selected from the group consisting of hydroxyl group-containing monomers, carboxyl group-containing monomers, amino group-containing monomers, and silicone-based vinyl monomers. This curable functional group-containing fluorinated polymer more preferably contains a polymerization unit based on a fluorine-containing monomer and a polymerization unit based on at least one curable functional group-containing monomer selected from the group consisting of hydroxyl group-containing monomers and carboxyl group-containing monomers.

The polymerization unit based on curable functional group-containing monomer is preferably 1 to 20 mol % with respect to the total polymerization units in the curable functional group-containing fluorinated polymer. A more preferred lower limit is 2 mol % and a more preferred upper limit is 10 mol %.

The fluorine-containing monomer, i.e., the monomer for forming a fluorinated polymer into which a curable functional group has been introduced, can be exemplified by tetrafluoroethylene, chlorotrifluoroethylene, vinylidene fluoride, vinyl fluoride, and fluorovinyl ether, and a single one of these may be used or two or more may be used.

Preferred among the preceding is at least one selection from the group consisting of tetrafluoroethylene, chlorotrifluoroethylene, and vinylidene fluoride, while at least one selection from the group consisting of tetrafluoroethylene and chlorotrifluoroethylene is even more preferred.

Specific examples of the curable functional group-containing monomer and the fluorinated polymer into which a curable functional group has been introduced are provided below.

The coating material of the present invention additionally contains a polyisocyanate compound (also referred to herebelow simply as the polyisocyanate compound) derived from at least one isocyanate (also referred to herebelow simply as the isocyanate) selected from the group consisting of xylylene diisocyanate (XDI) and bis(isocyanatomethyl)cyclohexane (hydrogenated XDI, H6XDI). This polyisocyanate compound functions as a curing agent in the coating material of the present invention. The use of such a polyisocyanate compound as a curing agent causes the cured coating film yielded by the coating material of the present invention to exhibit an excellent adherence to the sealant in a solar cell module. In addition, when this cured coating film is used together with a substrate (a water-impermeable sheet) to construct a solar cell module backsheet, the use of such a polyisocyanate compound as the curing agent causes the cured coating film to having an excellent resistance to blocking with respect to surfaces in contact with the cured coating film, for example, at a winding step.

The polyisocyanate compound can be exemplified by adducts obtained by the addition polymerization of the isocyanate with a trihydric or higher hydric aliphatic polyhydric alcohol, by isocyanurate structures (nurate structures) formed from the isocyanate, and by biurets formed from the isocyanate.

The adduct referenced above, for example, preferably has the structure represented by the following general formula (1)

[C1]

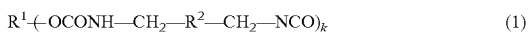

$$R^1\text{-}(OCONH\text{-}CH_2\text{-}R^2\text{-}CH_2\text{-}NCO)_k \quad (1)$$

(in the formula, $R^1$ represents a $C_{3-20}$ aliphatic hydrocarbyl group; $R^2$ represents the phenylene group or cyclohexylene group; and k is an integer from 3 to 20).

The $R^1$ in general formula (1) is a hydrocarbyl group based on the trihydric or higher hydric aliphatic polyhydric alcohol and more preferably is a $C_{3-10}$ aliphatic hydrocarbyl group and even more preferably is a $C_{3-6}$ aliphatic hydrocarbyl group.

When $R^2$ is the phenylene group, it may be the 1,2-phenylene group (o-phenylene group), 1,3-phenylene group (m-phenylene group), or 1,4-phenylene group (p-phenylene group). The 1,3-phenylene group (m-phenylene group) is preferred among these. The $R^2$ in general formula (1) may all be the same phenylene group, or a mixture of two or more phenylene group species may be present.

When $R^2$ is the cyclohexylene group, it may be the 1,2-cyclohexylene group, 1,3-cyclohexylene group, or 1,4-cyclohexylene group. The 1,3-cyclohexylene group is preferred among these. The $R^2$ in general formula (1) may all be the same cyclohexylene group, or a mixture of two or more cyclohexylene group species may be present.

k is a number corresponding to the valence of the trihydric or higher hydric aliphatic polyhydric alcohol. This k is more preferably an integer from 3 to 10 and even more preferably is an integer from 3 to 6.

The isocyanurate structure referenced above has one or two or more isocyanurate rings represented by the following general formula (2)

[C2]

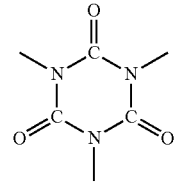

(2)

in the molecule.

This isocyanurate structure can be exemplified by the trimer provided by a trimerization reaction of the isocyanate, the pentamer provided by a pentamerization reaction of the isocyanate, and the heptamer provided by a heptamerization reaction of the isocyanate.

The trimer represented by the following general formula (3)

[C3]

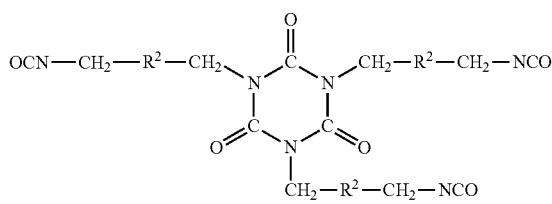

(3)

($R^2$ in the formula is the same as the $R^2$ in general formula (1)) is preferred among the preceding. Thus, the isocyanurate structure is preferably a trimer of at least one isocyanate selected from the group consisting of xylylene diisocyanate and bis(isocyanatomethyl)cyclohexane.

The biuret is a compound having the structure represented by the following general formula (4)

[C4]

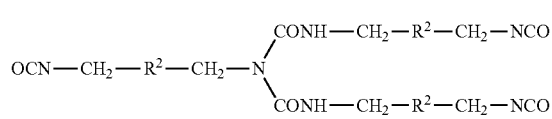

(4)

($R^2$ in the formula is the same as the $R^2$ in general formula (1)) and can be obtained by the trimerization of the isocyanate under conditions different from those for obtaining the isocyanurate.

Among the preceding, the polyisocyanate compound is preferably the adduct described above, i.e., is obtained by the addition polymerization of a trihydric or higher hydric aliphatic polyhydric alcohol with at least one isocyanate selected from the group consisting of xylylene diisocyanate and bis(isocyanatomethyl)cyclohexane.

Specific examples of this polyisocyanate compound are provided below.

The coating material of the present invention contains the curable functional group-containing fluorinated polymer and polyisocyanate compound that are described in the preceding, but may contain other components. A single such additional component or two or more additional components may be used.

The coating material of the present invention is described in additional detail herebelow using specific examples.

<The Curable Functional Group-Containing Fluorinated Polymer>

The curable functional group-containing monomer can be exemplified by the following, but is not limited only to these examples. A single one of these may be used or two or more may be used.

(1-1) The Hydroxyl Group-Containing Monomer:

The hydroxyl group-containing monomer can be exemplified by hydroxyl group-containing vinyl ethers, e.g., 2-hydroxyethyl vinyl ether, 3-hydroxypropyl vinyl ether, 2-hydroxypropyl vinyl ether, 2-hydroxy-2-methylpropyl vinyl ether, 4-hydroxybutyl vinyl ether, 4-hydroxy-2-methylbutyl vinyl ether, 5-hydroxypentyl vinyl ether, and 6-hydroxyhexyl vinyl ether, and by hydroxyl group-containing allyl ethers such as 2-hydroxyethyl allyl ether, 4-hydroxybutyl allyl ether, and glycerol monoallyl ether. The hydroxyl group-containing vinyl ethers, and particularly 4-hydroxybutyl vinyl ether and 2-hydroxyethyl vinyl ether, are preferred among the preceding for their excellent polymerization reactivity and excellent functional group curability.

The hydroxyalkyl esters of (meth)acrylic acid, e.g., 2-hydroxyethyl acrylate and 2-hydroxyethyl methacrylate, are examples of other hydroxyl group-containing monomers.

(1-2) The Carboxyl Group-Containing Monomer:

The carboxyl group-containing monomer can be exemplified by unsaturated carboxylic acids represented by general formula (5)

[C5]

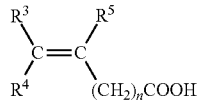

(5)

(in the formula, $R^3$, $R^4$, and $R^5$ are the same or different and are each a hydrogen atom, an alkyl group, the carboxyl group, or an ester group, and n is 0 or 1), e.g., unsaturated monocarboxylic acids and unsaturated dicarboxylic acids and their monoesters and anhydrides, and so forth, and can also be exemplified by carboxyl group-containing vinyl ether monomers represented by general formula (6)

[C6]

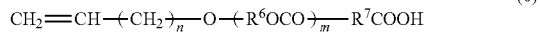

(6)

(in the formula, $R^6$ and $R^7$ are the same or different and are each a saturated or unsaturated, straight-chain or cyclic alkyl group, n is 0 or 1, and m is 0 or 1).

The unsaturated carboxylic acids represented by general formula (5) can be specifically exemplified by acrylic acid, methacrylic acid, vinylacetic acid, crotonic acid, cinnamic acid, 3-allyloxypropionic acid, 3-(2-allyloxyethoxycarbonyl)propionic acid, itaconic acid, monoesters of itaconic acid, maleic acid, maleate monoesters, maleic anhydride, fumaric acid, fumarate monoesters, vinyl phthalate, and vinyl pyromellitate. Among the preceding, crotonic acid, itaconic acid, maleic acid, maleate monoesters, fumaric acid, fumarate monoesters, and 3-allyloxypropionic acid are preferred because they have a low homopolymerizable and thus are resistant to the formation of homopolymers.

The carboxyl group-containing vinyl ether monomer represented by general formula (6) can be specifically exemplified by one or two or more selections from 3-(2-allyloxyethoxycarbonyl)propionic acid, 3-(2-allyloxybutoxycarbonyl)propionic acid, 3-(2-vinyloxyethoxycarbonyl)propionic acid, 3-(2-vinyloxybutoxycarbonyl)propionic acid, and so forth. Among the preceding, 3-(2-allyloxyethoxycarbonyl)propionic acid and so forth offer the advantages of good monomer stability and good polymerization reactivity and thus are preferred.

(1-3) The Amino Group-Containing Monomer:

The amino group-containing monomer can be exemplified by amino vinyl ethers represented by $CH_2=CH-O-(CH_2)_x-NH_2$ (x=0 to 10), allylamines represented by $CH_2=CH-O-CO(CH_2)_x-NH_2$ (x=1 to 10), and also aminomethylstyrene, vinylamine, acrylamide, vinylacetamide, and vinylformamide.

(1-4) The Silicone-Based Vinyl Monomer:

The silicone-based vinyl monomer can be exemplified by (meth)acrylate esters such as $CH_2=CHCO_2(CH_2)_3Si(OCH_3)_3$, $CH_2=CHCO_2(CH_2)_3Si(OC_2H_5)_3$, $CH_2=C(CH_3)CO_2(CH_2)_3Si(OCH_3)_3$, $CH_2=C(CH_3)CO_2(CH_2)_3Si(OC_2H_5)_3$, $CH_2=CHCO_2(CH_2)_3SiCH_3(OC_2H_5)_2$, $CH_2=C(CH_3)CO_2(CH_2)_3SiC_2H_5(OCH_3)_2$, $CH_2=C(CH_3)CO_2(CH_2)_3Si(CH_3)_2(OC_2H_5)$, $CH_2=C(CH_3)CO_2(CH_2)_3Si(CH_3)_2OH$, $CH_2=CH(CH_2)_3Si(OCOCH_3)_3$, $CH_2=C(CH_3)CO_2(CH_2)_3SiC_2H_5(OCOCH_3)_2$, $CH_2=C(CH_3)CO_2(CH_2)_3SiCH_3(N(CH_3)COCH_3)_2$, $CH_2=CHCO_2(CH_2)_3SiCH_3[ON(CH_3)C_2H_5]_2$, and $CH_2=C(CH_3)CO_2(CH_2)_3SiC_6H_5[ON(CH_3)C_2H_5]_2$; vinylsilanes such as $CH_2=CHSi[ON=C(CH_3)(C_2H_5)]_3$, $CH_2=CHSi(OCH_3)_3$, $CH_2=CHSi(OC_2H_5)_3$, $CH_2=CHSiCH_3(OCH_3)_2$, $CH_2=CHSi(OCOCH_3)_3$, $CH_2=CHSi(CH_3)_2(OC_2H_5)$, $CH_2=CHSi(CH_3)_2SiCH_3(OCH_3)_2$, $CH_2=CHSiC_2H_5(OCOCH_3)_2$, and $CH_2=CHSiCH_3[ON(CH_3)C_2H_5]_2$, vinyltrichlorosilane, and the partial hydrolyzates of the preceding; and vinyl ethers such as trimethoxysilylethyl vinyl ether, triethoxysilylethyl vinyl ether, trimethoxysilylbutyl vinyl ether, methyldimethoxysilylethyl vinyl ether, trimethoxysilylpropyl vinyl ether, and triethoxysilylpropyl vinyl ether.

The fluorinated polymer into which a curable functional group has been introduced can be exemplified by the following, categorized according to the polymerization units constituting the polymer.

(1) Perfluoroolefin-Based Polymers that Mainly Contain a Perfluoroolefin Unit:

These can be specifically exemplified by tetrafluoroethylene (TFE) homopolymers, copolymers between TFE and, e.g., hexafluoropropylene (HFP) or perfluoro(alkyl vinyl ether) (PAVE), and copolymers of the preceding with another copolymerizable monomer.

This other copolymerizable monomer can be exemplified by vinyl carboxylate esters such as vinyl acetate, vinyl propionate, vinyl butyrate, vinyl isobutyrate, vinyl pivalate, vinyl caproate, vinyl versatate, vinyl laurate, vinyl stearate, vinyl cyclohexylcarboxylate, vinyl benzoate, and vinyl para-t-butylbenzoate; alkyl vinyl ethers such as methyl vinyl ether, ethyl vinyl ether, butyl vinyl ether, and cyclohexyl vinyl ether; fluorine-free olefins such as ethylene, propylene, n-butene, and isobutene; and fluorine-containing monomers such as vinylidene fluoride (VdF), chlorotrifluoroethylene (CTFE), vinyl fluoride (VF), and fluorovinyl ether, but there is no limitation to only these.

Among the preceding, TFE-based polymers that mainly contain TFE are preferred for their excellent pigment dispersibility, excellent weathering resistance, excellent copolymerizability, and excellent chemical resistance.

Curable functional group-containing perfluoroolefin-based polymers can be specifically exemplified by copolymers of TFE/isobutylene/hydroxybutyl vinyl ether/other monomer, copolymers of TFE/vinyl versatate/hydroxybutyl vinyl ether/other monomer, and copolymers of TFE/VdF/hydroxybutyl vinyl ether/other monomer, while copolymers of TFE/isobutylene/hydroxybutyl vinyl ether/other monomer and copolymers of TFE/vinyl versatate/hydroxybutyl vinyl ether/other monomer are preferred.

An example of a TFE-based curable polymer composition for application as a coating material is the Zeffle GK series from Daikin Industries, Ltd.

(2) CTFE-Based Polymers that Mainly Contain the Chlorotrifluoroethylene (CTFE) Unit:

Specific examples here are copolymers of CTFE/hydroxybutyl vinyl ether/other monomer.

Examples of CTFE-based curable polymer compositions for application as a coating material are Lumiflon (registered trademark) from Asahi Glass Co., Ltd., Fluonate (registered trademark) from the DIC Corporation, Cefral Coat (registered trademark) from Central Glass Co., Ltd., and Zaflon (registered trademark) from Toagosei Co., Ltd.

(3) VdF-Based Polymers that Mainly Contain the Vinylidene Fluoride (VdF) Unit:

Specific examples here are VdF/TFE/hydroxybutyl vinyl ether/other monomer copolymers.

(4) Fluoroalkyl Group-Containing Polymers that Mainly Contain a Fluoroalkyl Unit:

Specific examples here are $CF_3CF_2(CF_2CF_2)_nCH_2CH_2OCOCH=CH_2$ (n=mixture of 3 and 4)/2-hydroxyethyl methacrylate/stearyl acrylate copolymers.

The fluoroalkyl group-containing polymer can be exemplified by Unidyne and Ftone, both from Daikin Industries, Ltd., and Zonyl from Du Pont Co., Ltd.

Among the preceding, the perfluoroolefin-based polymers are preferred when one considers the weathering resistance and moistureproofness.

The curable functional group-containing fluorinated polymer can be prepared, for example, by the method disclosed in JP-A 2004-204205.

The content of the curable functional group-containing fluorinated polymer in the coating material of the present invention is preferably 20 to 95 mass % where the total amount of nonvolatile components in the coating material is 100 mass %.

<The Polyisocyanate Compound>

When the polyisocyanate compound is an adduct between the isocyanate and a trihydric or higher hydric aliphatic polyhydric alcohol, this trihydric or higher hydric aliphatic polyhydric alcohol can be specifically exemplified by trihydric alcohols such as glycerol, trimethylolpropane (TMP), 1,2,6-hexanetriol, trimethylolethane, 2,4-dihydroxy-3-hydroxymethylpentane, 1,1,1-tris(bishydroxymethyl)propane, and 2,2-bis(hydroxymethyl)butan-3-ol; tetrahydric alcohols such as pentaerythritol and diglycerol; pentahydric alcohols (pentitols) such as arabitol, ribitol, and xylitol; and hexahydric alcohols (hexitols) such as sorbitol, mannitol, galactitol, and allodulcitol. Trimethylolpropane and pentaerythritol are preferred among the preceding.

The xylylene diisocyanate (XDI) that may be used as a constituent component of this adduct can be exemplified by 1,3-xylylene diisocyanate (m-xylylene diisocyanate), 1,2-xylylene diisocyanate (o-xylylene diisocyanate), and 1,4-xylylene diisocyanate (p-xylylene diisocyanate), where among 1,3-xylylene diisocyanate (m-xylylene diisocyanate) is preferred.

The bis(isocyanatomethyl)cyclohexane (hydrogenated XDI, H6XDI) that may be used as a constituent component of this adduct can be exemplified by 1,3-bis(isocyanatomethyl)cyclohexane, 1,2-bis(isocyanatomethyl)cyclohexane, and 1,4-bis(isocyanatomethyl)cyclohexane, where among 1,3-bis(isocyanatomethyl)cyclohexane is preferred.

An adduct favorable for use in the present invention is obtained by the addition polymerization of the previously described trihydric or higher hydric aliphatic polyhydric alcohol with the at least one isocyanate selected from the group consisting of xylylene diisocyanate and bis(isocyanatomethyl)cyclohexane.

A specific example of an adduct preferred for use in the present invention is a compound represented by the following general formula (7)

[C7]

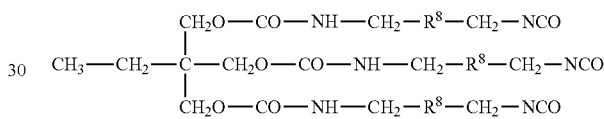

(7)

($R^8$ in the formula represents the phenylene group or cyclohexylene group), i.e., a polyisocyanate compound obtained by the addition polymerization of trimethylolpropane (TMP) and the at least one isocyanate selected from the group consisting of xylylene diisocyanate and bis(isocyanatomethyl)cyclohexane.

The phenylene group or cyclohexylene group represented by $R^8$ in general formula (7) is the same as cited for the $R^2$ in general formula (1).

Commercially available products for the polyisocyanate compound with general formula (7) can be exemplified by Takenate (registered trademark) D110N (from Mitsui Chemicals, Inc., an XDI/TMP adduct, NCO content=11.8%) and Takenate D120N (from Mitsui Chemicals, Inc., H6XDI/TMP adduct, NCO content=11.0%).

Specific examples of the polyisocyanate compound when it has an isocyanurate structure are Takenate D121N (from Mitsui Chemicals, Inc., H6XDInurate, NCO content=14.0%) and Takenate D127N (from Mitsui Chemicals, Inc., H6XDInurate, trimer of H6XDI, NCO content=13.5%).

The content of the polyisocyanate compound is 0.1 to 5 equivalents and preferably 0.5 to 1.5 equivalents per 1 equivalent of the curable functional groups in the curable functional group-containing fluorinated polymer.

The content of the curable functional group in the curable functional group-containing fluorinated polymer can be determined using a suitable combination, depending on the kind of monomer, of NMR, FT-IR, elemental analysis, x-ray fluorescence analysis, and neutralization titration.

In this Description, the content of the curable functional group-containing fluorinated polymer and the content of the polyisocyanate compound are based on the mass of the nonvolatile fraction excluding the respective solvents and so forth.

The coating material of the present invention can be prepared by the usual methods, formulated as, for example, a solvent-based coating material, water-based coating material, powder coating material, and so forth. Among these, solvent-based coating material formulations are preferred from the standpoints of the ease of film formation, curability, and excellence in drying.

The solvent in the solvent-based coating material is preferably an organic solvent and can be exemplified by esters such as ethyl acetate, butyl acetate, isopropyl acetate, isobutyl acetate, cellosolve acetate, and propylene glycol methyl ether acetate; ketones such as acetone, methyl ethyl ketone, methyl isobutyl ketone, and cyclohexanone; cyclic ethers such as tetrahydrofuran and dioxane; amides such as N,N-dimethylformamide and N,N-dimethylacetamide; aromatic hydrocarbons such as xylene, toluene, and solvent naphtha; glycol ethers such as propylene glycol methyl ether, and ethyl cellosolve; diethylene glycol esters such as carbitol acetate; aliphatic hydrocarbons such as n-pentane, n-hexane, n-heptane, n-octane, n-nonane, n-decane, n-undecane, n-dodecane, and mineral spirits; and mixed solvents of the preceding.

The esters are more preferred among the preceding, and butyl acetate is even more preferred.

When the coating material of the present invention is formulated as a solvent-based coating material, the concentration of the curable functional group-containing fluorinated polymer is preferably 5 to 95 weight % and more preferably 10 to 70 weight % where the total amount of the coating material is 100 mass %.

Various additives may additionally be incorporated in the coating material of the present invention in conformity with the properties required thereof. These additives can be exemplified by curing accelerators, pigments, pigment dispersants, defoamants, leveling agents, ultraviolet absorbers, light stabilizers, thickeners, adhesion promoters, matting agents, and so forth.

The curing accelerator can be exemplified by organotin compounds, acidic phosphate esters, reaction products from an acidic phosphate ester and amine, saturated and unsaturated polybasic carboxylic acids and their anhydrides, organotitanate compounds, amine compounds, and lead octylate.

A single curing accelerator may be used or two or more may be used in combination. The curing accelerator is incorporated, expressed per 100 weight parts of the curable functional group-containing fluorinated polymer, preferably at approximately $1.0 \times 10^{-6}$ to $1.0 \times 10^{-2}$ weight parts and more preferably at approximately $5.0 \times 10^{-5}$ to $1.0 \times 10^{-3}$ weight parts.

The coating material of the present invention preferably also contains a pigment. This serves to endow the resulting cured coating film with an excellent UV-blocking performance. The addition of a pigment is also highly desirable from the standpoint of providing the solar cell module with an aesthetically pleasing appearance.

The pigment can be specifically exemplified by inorganic pigments, e.g., titanium oxide and calcium carbonate, which are white pigments, and carbon black and composite metals such as Cu—Cr—Mn alloys, which are black pigments, and by organic pigments such as phthalocyanine compounds, quinacridone compounds, and azo compounds; however, there is no limitation to only these.

The amount of pigment addition, expressed per 100 weight parts of the curable functional group-containing fluorinated polymer, is preferably 0.1 to 200 weight parts and is more preferably 0.1 to 160 weight parts.

The coating material of the present invention preferably additionally contains an ultraviolet absorber. Because solar cells are used on a long-term basis outdoors under strong ultraviolet exposure, countermeasures are required to the ultraviolet-induced degradation of the backsheet. The addition of an ultraviolet absorber to the coating material of the present invention can impart an ultraviolet-absorbing capacity to the cured coating film layer.

An organic or inorganic ultraviolet absorber can be used as the ultraviolet absorber. The organic compounds can be exemplified by salicylate esters, benzotriazoles, benzophenones, and cyanoacrylates, while filler-type inorganic ultraviolet absorbers such as zinc oxide, cerium oxide, and so forth are preferred for the inorganic compounds.

A single ultraviolet absorber may be used by itself or a combination of two or more may be used. The amount of the ultraviolet absorber is preferably 0.1 to 15 mass % where 100 mass % is the total amount of the curable functional group-containing fluorinated polymer in the coating material. A satisfactory improvement in the light resistance is not obtained when the amount of the ultraviolet absorber is too small, while the effect is saturated when the amount of the ultraviolet absorber is too large.

The present invention is also the coating film obtained from the hereabove-described coating material. This coating film can be formed, in conformity with the service, by coating the coating material of the present invention on a suitable substrate and curing. Formation of the cured coating film on a substrate is carried by coating the substrate with the coating material of the present invention in conformity with the formulation of this coating material.

Coating may be carried out within the range of ordinary temperature conditions for the coating regime, and, in the case of a solvent-based coating material, curing and drying are performed at 10° C. to 300° C. and generally 100° C. to 200° C. for 30 seconds to 3 days. Accordingly, materials for which a high-temperature process is desirably avoided, such as Si-deposited PET sheet, can be unproblematically used as the water-impermeable sheet when the coating material of the present invention is used for coating a solar cell module backsheet. An aftercure may be performed after curing and drying, and this aftercure is typically completed at 20° C. to 300° C. in 1 minute to 3 days.

Coating of the substrate may be performed by direct application of the coating material of the present invention to the substrate or by application across, for example, a primer layer.

Such a primer layer may be formed by the usual methods using a heretofore known primer coating material. Epoxy resins, urethane resins, acrylic resins, silicone resins, and polyester resins are typical examples of primer coating materials.

The film thickness of the cured coating film is preferably made at least 5 µm from the standpoint of obtaining an excellent hiding power, weathering resistance, chemical resistance, and moisture resistance. At least 7 µm is more preferred and at least 10 µm is even more preferred. Because weight reduction is not achieved when the cured coating film is overly thick, the upper limit is preferably about 1000 µm and more preferably about 100 µm. A film thickness of 10 to 40 µm is particularly preferred.

The coating film obtained from the coating material of the present invention not only has an excellent adherence for the EVA generally used as a sealant in solar cell modules, but, because it also exhibits an excellent blocking resistance when wound, can be particularly favorably used for coating a solar cell module backsheet that is typically produced using a winding step.

This coating film may be formed on one side or both sides of the substrate, e.g., a water-impermeable sheet, when it is used for coating a solar cell module backsheet.

In instances where a coating film obtained from the coating material of the present invention is formed on one surface of a substrate and the other surface of the substrate remains an uncoated surface, the coating film will then be placed in contact with the uncoated surface of the substrate during a winding step. In instances, on the other hand, where this coating film is formed on one surface of the substrate and a coating film from another coating material (as described below, a cured coating film from a curable functional group-free fluorinated polymer coating material, a coating film from a polyester coating material, a primer layer, and so forth) or another sheet is disposed on the other side of the substrate, the coating film obtained from the coating material of the present invention will then be placed in contact during a winding step with the other sheet or with the other coating material-derived coating film on the substrate. In addition, in instances where the coating film obtained from the coating material of the present invention is formed on both surfaces of a substrate, this coating film will then be placed in contact during a winding step with the same kind of coating film formed on the other surface of the substrate.

In all of these instances, the coating film obtained from the coating material of the present invention can exhibit an excellent blocking resistance with respect to the surface in contact with it.

The present invention is also a solar cell module backsheet that has a water-impermeable sheet and a coating film formed from the hereabove-described coating material and formed on at least one side of this water-impermeable sheet.

This water-impermeable sheet is a layer disposed to prevent the permeation of moisture into the sealant and solar cell. Any material that substantially does not permeate water can be used, but, viewed in terms of weight, cost, and flexibility, PET sheet, Si-deposited PET sheet, and thin metal sheet, e.g., of aluminum, stainless steel, and so forth, are often used. PET sheet is frequently used among the preceding. The thickness is generally about 50 to 250 µm. An Si-deposited PET sheet is frequently used when moistureproofness is a particular requirement. This thickness is generally about 10 to 20 µm.

A heretofore known surface treatment may be carried out on the water-impermeable sheet in order to improve the adhesiveness with the coating film. This surface treatment can be exemplified by corona discharge treatments, plasma discharge treatments, chemical conversion treatments, and, in the case of a metal sheet, blast treatments.

The method for forming the coating film on the water-impermeable sheet is as previously described.

The coating film may be formed on only one side of the water-impermeable sheet or may be formed on both sides.

The resulting backsheet has an excellent adherence to sealants, and as a consequence a solar cell module provided with this backsheet resists the formation of voids at the sealant/backsheet interface and can then more reliably and securely protect the solar cell.

The present invention is also a solar cell module that has a water-impermeable sheet, a coating film formed from the hereabove-described coating material and formed on at least one side of the water-impermeable sheet, and a sealant layer formed on the coating film.

Examples of preferred structures for the solar cell module are given in FIGS. 1 to 3.

In a first structure, shown in FIG. 1, a solar cell 1 is sealed in a sealant layer 2 and this sealant layer 2 is sandwiched by a surface layer 3 and a backsheet 4. The backsheet 4 is additionally constituted of a water-impermeable sheet 5 and a cured coating film 6 obtained from the coating material of the present invention. The cured coating film 6 is disposed only on the sealant layer 2 side in this first structure.

The sealant layer 2 is constituted of, for example, an ethylene/vinyl acetate copolymer (EVA), polyvinyl butyral (PVB), silicone resin, epoxy resin, acrylic resin, and so forth.

A glass plate is typically used for the surface layer 3, but a flexible material, e.g., a plastic sheet, may also be used.

A second structure, shown in FIG. 2, has a three-layer structure in which the cured coating film 6 is formed on both sides of the water-impermeable sheet 5.

This second structure, while having an increased film thickness for the backsheet, combines the advantages both of the adherence provided by the cured coating film 6 on the sealant layer 2 side and the weathering resistance provided by the cured coating film 6 on the side opposite from the sealant layer 2.

The three-layer backsheet may also be a backsheet having a three-layer structure in which a cured coating film obtained from the coating material of the present invention is formed on one side of the water-impermeable sheet and on the other side there is formed a cured coating film from a curable functional group-free fluorinated polymer, or a fluorinated polymer sheet, or a polyester sheet, or a polyester coating material-derived coating film (other sheet or coating film).

A third structure, shown in FIG. 3, is a structure in which a cured coating film 6 obtained from the coating material of the present invention is formed on the sealant layer 2 side of the water-impermeable sheet 5 and a different coating film 7 is formed on the side opposite from the sealant layer 2.

The material constituting the coating film 7 may be a cured coating film from a curable functional group-free fluorinated polymer coating material, or a fluorinated polymer sheet, or a polyester sheet, or a coating film from a polyester coating material.

The coating film may be subjected to a heretofore known surface treatment in order to improve the adhesiveness between the coating film and the sealant layer still further. This surface treatment can be exemplified by corona discharge treatments, plasma discharge treatments, chemical conversion treatments, and blast treatments.

The cured coating film from a curable functional group-free fluorinated polymer coating material can be exemplified by a cured coating film from a coating material provided by the incorporation of a tetraalkoxysilane or partial hydrolyzate thereof into PVdF, as described in JP-A 2004-214342; a cured coating film from a mixed coating material of VdF/TFE/CTFE copolymer and an alkoxysilane unit-containing acrylic resin; a cured coating film from a mixed coating material of VdF/TFE/HFP copolymer and a hydroxyl group-containing acrylic resin; and a cured coating film from a coating material provided by the incorporation of an aminosilane coupling agent into a VdF/HFP copolymer. A film thickness here generally of 5 to 300 µm is preferred from the standpoint of obtaining an excellent hiding power, weathering resistance, chemical resistance, and moisture resistance. 10 to 100 µm is more preferred and 10 to 50 µm is even more preferred. An interposed primer layer and so forth may also be present in these cases.

The previously mentioned fluorinated polymer sheet can be, for example, a fluorinated polymer sheet as used in existing backsheets, e.g., a PVdF sheet or PVF sheet, a PCTFE sheet, a TFE/HFP/ethylene copolymer sheet, a TFE/HFP copolymer (FEP) sheet, a TFE/PAVE copolymer (PFA) sheet, an ethylene/TFE copolymer (ETFE) sheet, or an ethylene/CTFE copolymer (ECTFE) sheet. A film thickness here generally of 5 to 300 µm is preferred from the standpoint of obtaining an excellent weathering resistance. 10 to 100 µm is more preferred and 10 to 50 µm is even more preferred.

A polyester sheet as used in conventional backsheets can be used without modification as the polyester sheet referenced above, and its adhesion to the water-impermeable sheet 5 can be carried out with, for example, an acrylic adhesive, a urethane adhesive, an epoxy adhesive, or a polyester adhesive. A film thickness generally of 5 to 300 µm is preferred from the standpoint of obtaining an excellent weathering resistance, an excellent cost, and an excellent transparency. 10 to 100 µm is more preferred and 10 to 50 µm is even more preferred.

The polyester coating material referenced above can be exemplified by polyester coating materials that use a saturated polyester resin that uses a polybasic carboxylic acid and a polyhydric alcohol and by polyester coating materials that use an unsaturated polyester resin that uses a glycol and maleic anhydride, fumaric acid, and so forth. The coating film can be formed by a coating method such as roll coating, curtain coating, spray coating, and die coating. A film thickness here generally of 5 to 300 µm is preferred from the standpoint of obtaining an excellent hiding power, weathering resistance, chemical resistance, and moisture resistance. 10 to 100 µm is more preferred and 10 to 50 µm is even more preferred. An interposed primer layer and so forth may also be present in this case.

In addition to its application to solar cell modules as described in the preceding, the coating material of the present invention can be coated—as a coating material for indoor use, e.g., for building materials and interior finishing materials, or as a coating material for outdoor use, e.g., for building materials, automobiles, aircraft, ships, and trains—directly on metals, concrete, plastics, and so forth, or can be coated thereon layered on a primer, e.g., a wash primer, antirust coating material, epoxy coating material, acrylic resin coating material, polyester resin coating material, and so forth. In particular, the coating material of the present invention can be favorably used, for example, for a coating film layer that adheres to an EVA layer and with various film or sheet materials that are produced via a winding step.

Advantageous Effects of Invention

The coating material of the present invention, because it has the structure described in the preceding, can form a coating film that exhibits an excellent adherence with the sealants in solar cell modules and particularly with EVA and that exhibits an excellent blocking resistance when wound up. Such a coating film is very useful as a coating for solar cell module backsheets.

DESCRIPTION OF EMBODIMENTS

The present invention is described in additional detail through examples, but the present invention is not limited to or by these examples.

Preparation Example 1

202 mass parts of a curable TFE-based copolymer (Zeffle GK570 from Daikin Industries, Ltd., solids fraction=65 mass %, hydroxyl value=60 mg KOH/g, solvent: butyl acetate), 263 mass parts titanium oxide (D918 from Sakai Chemical Industry Co., Ltd.) as a white pigment, and 167 mass parts butyl acetate were preliminarily mixed by stirring; this was followed by the introduction of 632 mass parts glass beads having a diameter of 1.2 mm and dispersion for 1 hour at 1500 rpm in a pigment disperser. The glass beads were then filtered off using a #80 mesh sieve, and 283 mass parts of a curable TFE-based copolymer (Zeffle GK570) and 85 mass parts butyl acetate were added to the resulting solution to prepare a white coating material.

100 mass parts of this white coating material and 13 mass parts of a curing agent (Takenate D110N from Mitsui Chemicals, Inc., XDI/TMP adduct, NCO content=11.8%, corresponds to 1.0 equivalent per 1 equivalent of the curable functional groups in the curable TFE-based copolymer) were blended to prepare a coating material 1.

Example 1

A PET film (Lumirror (registered trademark) S10, from Toray Industries, Inc., thickness=250 µm, sheet A) was used as the water-impermeable sheet; the coating material 1 prepared in Preparation Example 1 was coated on one side of this sheet A using a coater to provide a dry film thickness of 10 µm; and a backsheet A1 with a two-layer structure was then prepared by drying for 2 minutes at 120° C. The blocking resistance of this sample was investigated. The result is given in Table 1.

Figure 1:
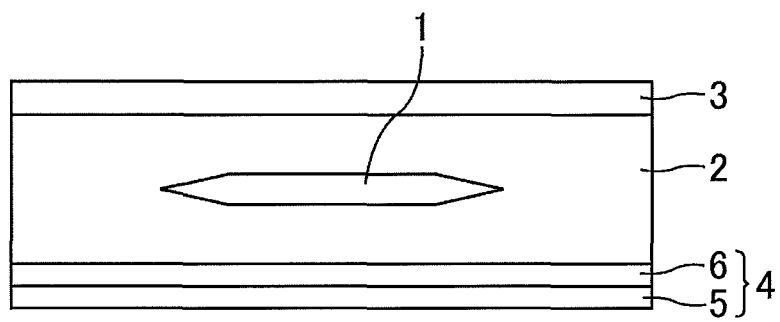
FIG. 1 is a schematic cross-sectional diagram of a first structure of a solar cell module.
Figure 2:
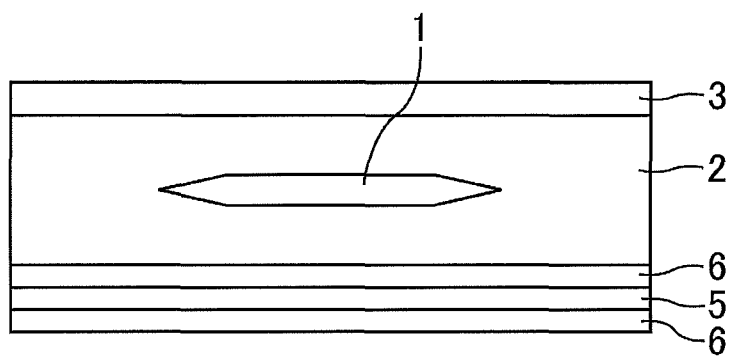
FIG. 2 is a schematic cross-sectional diagram of a second structure of a solar cell module.
Figure 3:
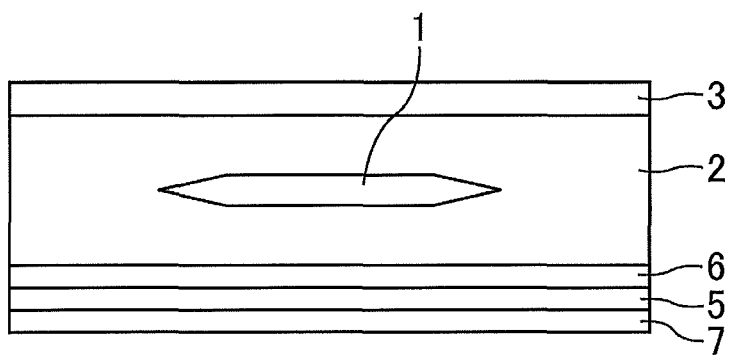
FIG. 3 is a schematic cross-sectional diagram of a third structure of a solar cell module.

This backsheet A1 was then aftercured for 48 hours at 40° C.; an EVA resin sheet (Solar EVA (registered trademark), from Mitsui Chemicals Fabro Inc., thickness=600 µm) was placed on its coating film side and glass (thickness=3.2 mm) was placed on the EVA resin sheet; and a sample A1 with a three-layer structure (structure shown in FIG. 1) was fabricated by press-bonding at 150° C. and a pressure of 100 g/cm$^2$. The adherence (between the EVA and the coating film) for this glass/EVA/backsheet bonded sample A1 was investigated. The result is given in Table 1.

The test and measurement methods are described below.
(The Adherence (Adhesive Strength))

The EVA/backsheet part of the glass/EVA/backsheet bonded sample was cut to a length of 15 cm×width of 1 cm and was submitted to a 180° peeling test using a Tensilon (Orientec Co., Ltd.) and the adhesive strength between the EVA resin sheet and coating film was measured in units of N/cm.

(Test of the Blocking Resistance)

This was carried out based on JIS K 5600-3-5. The prepared coating material was applied on 50 mm×100 mm PET film and was dried by heating in a drier (SPHH-400 from the ESPEC Corp.) at 120° C. for 2 minutes. The test specimen was thereafter withdrawn and allowed to cool to room temperature. Films were then sandwiched by glass so the coated side of the test specimen and an uncoated side overlapped with each other over an area of 50 mm×50 mm. A 20 kg weight was mounted thereon to apply a pressure of 0.08 MPa to the contact surface between the films, followed by holding in this state at 40° C. for 24 hours.

For the evaluation, the two films were allowed to cool to room temperature and were then pulled in the opposite directions. The backsheet A1-versus-PET peelability and degree of disturbance in the coating film were visually evaluated from the status at this point and were evaluated on a 5-level scale.

Evaluation Scores on Scale Ranging from 5 to 1
5: Separation occurs spontaneously.
4: The two sheets are separated using a very slight force.
3: Separation occurs when force is applied and the surface of the coating film is slightly disturbed.
2: Separation occurs when force is applied and the surface of the coating film is disturbed.
1: Separation cannot be brought about even with the application of force.

(The Film Thickness)

This was measured using a micrometer (Mitutoyo Corporation) based on JIS C 2151.

Example 2

A coating material 2 was prepared proceeding as in Preparation Example 1, but in this case using Takenate D120N (Mitsui Chemicals, Inc., H6XDI/TMP adduct, NCO content=11.00) as the curing agent, and a backsheet A2 having a two-layer structure was then prepared proceeding as in Example 1. The blocking resistance of this sample was investigated. In addition, a glass/EVA/backsheet bonded sample A2 with a three-layer structure was fabricated proceeding as in Example 1. The adherence (between the EVA and the coating film) was investigated as in Example 1 for this glass/EVA/backsheet bonded sample A2.

The results are given in Table 1.

Comparative Example 1

A comparative coating material 1 was prepared proceeding as in Preparation Example 1, but in this case using Coronate (registered trademark) HX (Nippon Polyurethane Industry Co., Ltd., isocyanurate structure from hexamethylene diisocyanate, NCO content=21.1%) as the curing agent, and a comparative backsheet A1 having a two-layer structure was then prepared proceeding as in Example 1. The blocking resistance of this sample was investigated. In addition, a glass/EVA/backsheet bonded comparative sample A1 with a three-layer structure was fabricated proceeding as in Example 1. The adherence (between the EVA and the coating film) was investigated as in Example 1 for this glass/EVA/backsheet bonded comparative sample A1.

The results are given in Table 1.

TABLE 1

| | | Example 1 | Example 2 | Comparative Example 1 |
|---|---|---|---|---|
| Component | Fluorinated polymer | GK570 | GK570 | GK570 |
| | Pigment | White (TiO$_2$) | White (TiO$_2$) | White (TiO$_2$) |
| | Curing agent | D110N | D120N | Coronate HX |
| Evaluation of coating film properties | Adhesiveness to EVA (N/cm) | 50 | 60 | 15 |
| | Blocking resistance | 4 | 4 | 2 |

The results for Examples 1 and 2 and Comparative Example 1 demonstrated that the coating films in Examples 1 and 2—which used as their curing agent a polyisocyanate compound derived from at least one isocyanate selected from the group consisting of xylylene diisocyanate and bis(isocyanatomethyl)cyclohexane—were superior in both their blocking resistance and adhesiveness to EVA to the coating film of Comparative Example 1, which used a heretofore used curing agent. It was thus confirmed that the structure of the present invention has technical significance.

REFERENCE SIGNS LIST

1: solar cell
2: sealant layer
3: surface layer
4: backsheet
5: water-impermeable sheet
6: cured coating film
7: other coating film

The invention claimed is:

1. A coating material comprising:
a curable functional group-containing fluorinated polymer; and
a polyisocyanate compound derived from at least one isocyanate selected from the group consisting of xylylene diisocyanate and bis(isocyanatomethyl)cyclohexane.

2. The coating material according to claim 1, wherein the curable functional group-containing fluorinated polymer comprises a polymerization unit based on a fluorine-containing monomer and a polymerization unit based on at least one curable functional group-containing monomer selected from the group consisting of hydroxyl group-containing monomers, carboxyl group-containing monomers, amino group-containing monomers, and silicone-based vinyl monomers.

3. The coating material according to claim 2, wherein the fluorine-containing monomer is at least one selected from the group consisting of tetrafluoroethylene, chlorotrifluoroethylene, and vinylidene fluoride.

4. The coating material according to claim 1, wherein the polyisocyanate compound is obtained by addition polymerization of
at least one isocyanate selected from the group consisting of xylylene diisocyanate and bis(isocyanatomethyl)cyclohexane and
a trihydric or higher hydric aliphatic polyhydric alcohol.

5. The coating material according to claim 1, further comprising a pigment.

6. The coating material according to claim 1, further comprising an ultraviolet absorber.

7. A coating film obtained from the coating material according to claim 1.

8. A backsheet for a solar cell module, comprising:
a water-impermeable sheet; and
a coating film formed from the coating material according to claim 1 and formed on at least one side of the water-impermeable sheet.

9. A solar cell module, comprising:
a water-impermeable sheet;
a coating film formed from the coating material according to claim 1 and formed on at least one side of the water-impermeable sheet; and
a sealant layer formed on the coating film.

* * * * *